(12) United States Patent
Honda et al.

(10) Patent No.: US 11,626,294 B2
(45) Date of Patent: Apr. 11, 2023

(54) SUBSTRATE PROCESSING METHOD, SUBSTRATE PROCESSING APPARATUS AND RECORDING MEDIUM

(71) Applicant: Tokyo Electron Limited, Tokyo (JP)

(72) Inventors: Takumi Honda, Kumamoto (JP); Koji Kagawa, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/802,936

(22) Filed: Feb. 27, 2020

(65) Prior Publication Data

US 2020/0279752 A1 Sep. 3, 2020

(30) Foreign Application Priority Data

Mar. 1, 2019 (JP) .............................. JP2019-037982
Jan. 21, 2020 (JP) .............................. JP2020-007203

(51) Int. Cl.
*H01L 21/3213* (2006.01)
*H01L 21/67* (2006.01)
*H01L 21/306* (2006.01)

(52) U.S. Cl.
CPC .. *H01L 21/32134* (2013.01); *H01L 21/30604* (2013.01); *H01L 21/67086* (2013.01)

(58) Field of Classification Search
None
See application file for complete search history.

(56) References Cited

U.S. PATENT DOCUMENTS

| 9,330,937 B2 * | 5/2016 | Nowling | H01J 37/32357 |
| 2011/0230053 A1 * | 9/2011 | Matsuda | H01L 21/30604 |
| | | | 438/745 |
| 2011/0315228 A1 * | 12/2011 | Yokota | B01F 35/83 |
| | | | 137/561 R |
| 2015/0200112 A1 * | 7/2015 | Han | C23F 1/26 |
| | | | 438/478 |
| 2016/0351417 A1 * | 12/2016 | Akeboshi | H01L 21/6708 |

FOREIGN PATENT DOCUMENTS

JP 5448521 B2 3/2014

* cited by examiner

*Primary Examiner* — Stephanie P Duclair
(74) *Attorney, Agent, or Firm* — Pearne & Gordon LLP

(57) ABSTRACT

A substrate processing method includes etching a substrate having a first film and a second film at a first etching rate; changing an etching rate from the first etching rate to a second etching rate; and etching the substrate at the second etching rate.

8 Claims, 9 Drawing Sheets

FIG. 4

| | FIRST ETCHING PROCESSING | CHANGE PROCESSING | SECOND ETCHING PROCESSING |
|---|---|---|---|
| SECOND VALVE (DRAIN) | OFF | ON | OFF |
| THIRD VALVE | ON OFF ON | OFF | ON OFF ON |
| WATER CONCENTRATION | (high, decreasing) | (decreasing) | (low) |
| FOURTH VALVE | OFF | ON | OFF |
| PHOSPHORIC ACID CONCENTRATION | (low) | (increasing) | (high) |
| FIFTH VALVE | OFF ON OFF ON | OFF | ON OFF ON OFF ON |
| ACETIC ACID CONCENTRATION | (high, decreasing) | (decreasing) | (low) |
| SIXTH VALVE | OFF ON OFF ON | ON | OFF ON OFF ON |
| NITRIC ACID CONCENTRATION | (constant) | (constant) | (constant) |

SUBSTRATE PROCESSING METHOD, SUBSTRATE PROCESSING APPARATUS AND RECORDING MEDIUM

CROSS-REFERENCE TO RELATED APPLICATION

This application claims the benefit of Japanese Patent Application Nos. 2019-037982 and 2020-007203 filed on Mar. 1, 2019 and Jan. 21, 2020, respectively, the entire disclosures of which are incorporated herein by reference.

TECHNICAL FIELD

The exemplary embodiments described herein pertain generally to a substrate processing method, a substrate processing apparatus and a recording medium.

BACKGROUND

Conventionally, an etching process for etching a film formed on a substrate such as a semiconductor wafer has been known as one of semiconductor manufacturing processes.
Patent Document 1: Specification of Japanese Patent No. 5,448,521

SUMMARY

In an exemplary embodiment, a substrate processing method includes etching a substrate having a first film and a second film at a first etching rate; changing an etching rate from the first etching rate to a second etching rate; and etching the substrate at the second etching rate.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

FIG. 4 is a diagram provided to explain a change processing according to the first exemplary embodiment;

DETAILED DESCRIPTION

Figure 1:
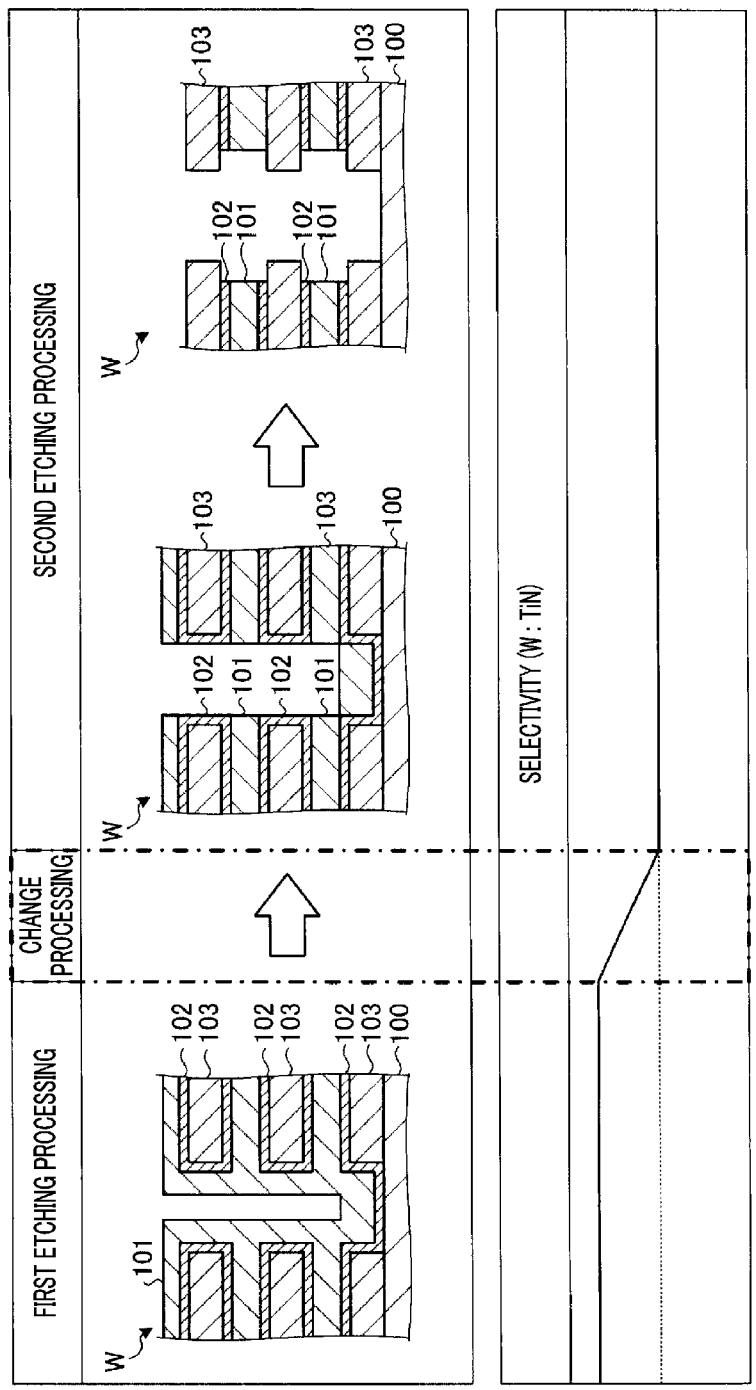
FIG. 1 is a diagram provided to explain a substrate processing according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

The following exemplary embodiments are examples for describing the present disclosure, and the present disclosure is not limited thereto. In the following description, same parts or parts having same function will be assigned same reference numerals, and redundant description will be omitted.

Hereinafter, embodiments (hereinafter, referred to as "exemplary embodiments") of a substrate processing method, a substrate processing apparatus and a recording medium according to the present disclosure will be described in detail with reference to the accompanying drawings. Further, the substrate processing method, the substrate processing apparatus and the recording medium of the present disclosure are not limited to the following exemplary embodiments. Furthermore, the exemplary embodiments can be appropriately combined as long as processing contents are not contradictory to each other. Also, in each of the embodiments described below, same parts will be assigned same reference numerals, and redundant description will be omitted.

Further, in each of the accompanying drawings, for the purpose of clear understanding, there may be used a rectangular coordinate system in which the X-axis direction, Y-axis direction and Z-axis direction which are orthogonal to one another are defined and the positive Z-axis direction is defined as a vertically upward direction.

First Exemplary Embodiment

Substrate Processing of First Exemplary Embodiment

First, a substrate processing according to a first exemplary embodiment will be described with reference to FIG. 1. FIG. 1 is a diagram provided to explain the substrate processing according to the first exemplary embodiment.

As illustrated in FIG. 1, in the substrate processing according to the first exemplary embodiment, for example, etching is performed on a wafer W having a tungsten film 101, a titanium nitride film 102 and a silicon oxide film 103 formed on a polysilicon film 100. Specifically, the silicon oxide film 103 is formed as a plurality of layers spaced apart from each other on the polysilicon film 100, and the titanium nitride film 102 is formed around each layer of the silicon oxide film 103 to cover the silicon oxide film 103. Further, the tungsten film 101 is formed to cover the titanium nitride film 102 and the silicon oxide film 103. Therefore, before the etching is performed, the titanium nitride film 102 and the silicon oxide film 103 are covered by the tungsten film 101.

In the substrate processing according to the first exemplary embodiment, a recess is formed on the wafer W by etching back the tungsten film 101 and the titanium nitride film 102. In the substrate processing according to the first exemplary embodiment, a chemical liquid containing phosphoric acid ($H_3PO_4$), acetic acid ($CH_3COOH$), nitric acid ($HNO_3$) and water ($H_2O$) as components is used to etch the tungsten film 101 and the titanium nitride film 102.

Specifically, in the substrate processing according to the first exemplary embodiment, the titanium nitride film 102 is exposed by etching only the tungsten film 101 (first etching processing). Then, in the substrate processing according to the first exemplary embodiment, the tungsten film 101 and the titanium nitride film 102 are simultaneously etched (second etching processing).

In the second etching processing of simultaneously etching the tungsten film 101 and the titanium nitride film 102, the selectivity between the tungsten film 101 and the titanium nitride film 102 is desirably 1:1. However, if a series of processings are performed using the chemical liquid containing the above-described components mixed at a mixing ratio where the selectivity is 1:1, a time required for the etching of the tungsten film 101 in the first etching processing may become long, which is not efficient.

Therefore, in the substrate processing according to the first exemplary embodiment, the first etching processing is performed using a chemical liquid containing the components mixed at a mixing ratio at which the selectivity of the tungsten film 101 to the titanium nitride film 102 exceeds 1. Thus, an etching rate of the tungsten film 101 in the first etching processing can be higher than an etching rate of the tungsten film 101 when the first etching processing is performed using the chemical liquid with the selectivity of 1:1. Accordingly, in the first etching processing, the tungsten film 101 can be etched in a short time. In other words, the processing time required for the first etching processing can be reduced.

Then, in the substrate processing according to the first exemplary embodiment, a change processing configured to change the etching rate of the tungsten film 101 is performed. Specifically, in the substrate processing according to the first exemplary embodiment, the etching rate of the tungsten film 101 is lowered by changing mixing ratios of the respective components in the chemical liquid, and, thus, the selectivity between the tungsten film 101 and the titanium nitride film 102 can be adjusted to 1:1.

Here, the present inventors have discovered by experiment that as the ratio of water in the chemical liquid increases compared with the other components in the chemical liquid, the etching rates of the tungsten film 101 and the titanium nitride film 102, particularly, the etching rate of the tungsten film 101 increases. Accordingly, in the substrate processing according to the first exemplary embodiment, the mixing ratio of the chemical liquid is changed to allow the concentration of water in the chemical liquid in the second etching processing to be lower than the concentration of water in the chemical liquid in the first etching processing, and, thus, the etching rate of the tungsten film 101 is lowered. Details thereof will be described later.

In the substrate processing according to the first exemplary embodiment, the change processing just needs to be completed before the first etching processing is completed, i.e., before the titanium nitride film 102 is exposed through the tungsten film 101.

Then, in the substrate processing according to the first exemplary embodiment, the second etching processing of simultaneously etching the tungsten film 101 and the titanium nitride film 102 is performed. The selectivity between the tungsten film 101 and the titanium nitride film 102 is changed to 1:1 by the change processing before the second etching processing is started. For this reason, in the second etching processing of the substrate processing according to the first exemplary embodiment, the tungsten film 101 and the titanium nitride film 102 can be etched at the same etching rate. Therefore, the recess can be formed on the wafer W with high accuracy.

As described above, in the first etching processing of the substrate processing according to the first exemplary embodiment, the tungsten film 101 is etched at a first etching rate. Also, in the substrate processing according to the first exemplary embodiment, the etching rate of the tungsten film 101 is lowered from the first etching rate to a second etching rate to change the selectivity between the tungsten film 101 and the titanium nitride film 102 to 1:1. Further, in the substrate processing according to the first exemplary embodiment, the second etching processing of etching the tungsten film 101 and the titanium nitride film 102 with a selectivity of 1:1 is performed.

Therefore, the wafer W having various types of films can be etched with high efficiency by the substrate processing according to the first exemplary embodiment.

<Configuration of Substrate Processing Apparatus>

Figure 2:
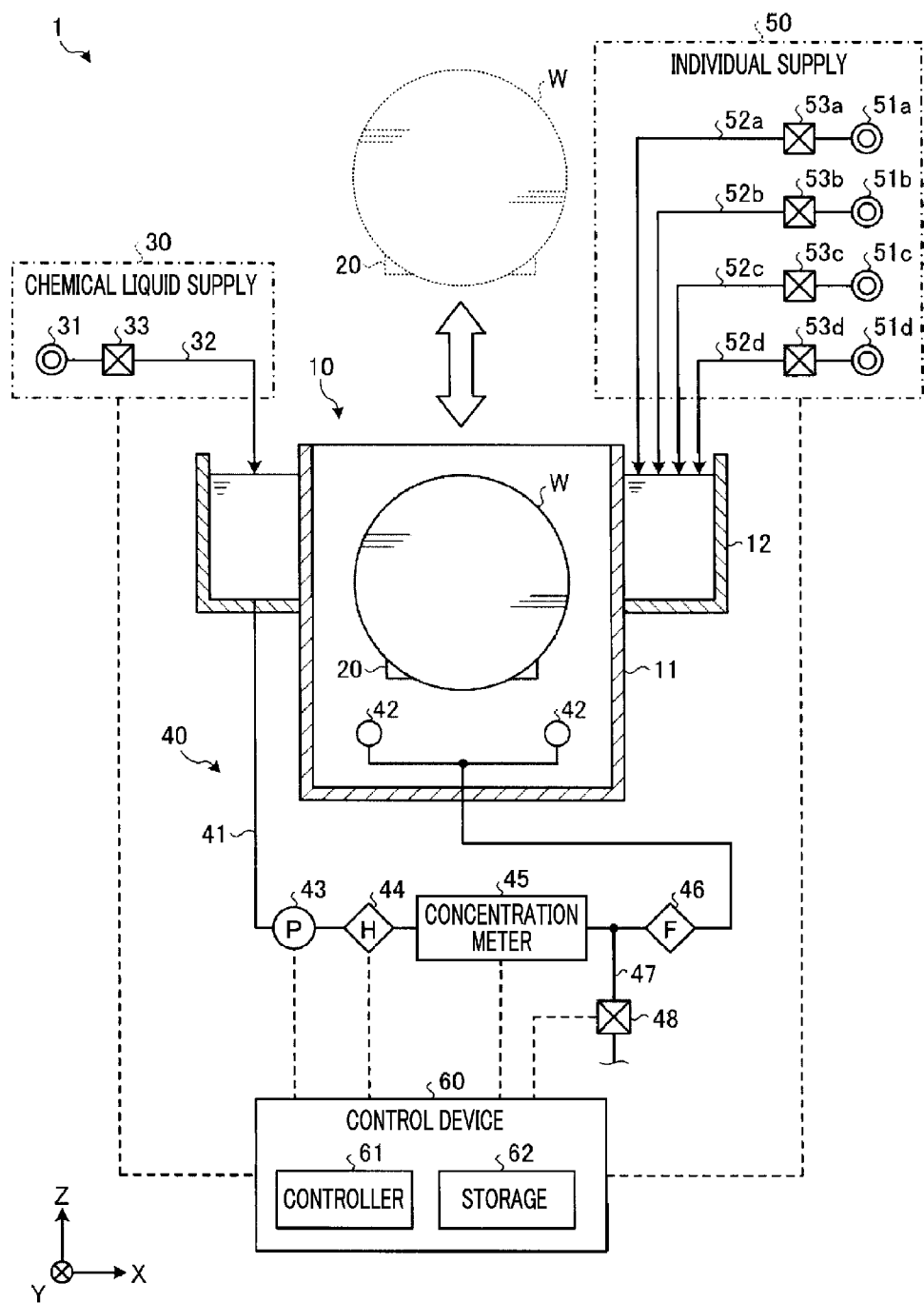
FIG. 2 is a diagram illustrating a configuration of a substrate processing apparatus according to the first exemplary embodiment.

Then, a configuration of a substrate processing apparatus configured to perform the above-described substrate processing will be described with reference to FIG. 2. FIG. 2 is a diagram illustrating a configuration of the substrate processing apparatus according to the first exemplary embodiment.

A substrate processing apparatus 1 illustrated in FIG. 2 is configured to perform an etching processing to a plurality of wafers W all at once by immersing the plurality of wafers W maintained in a vertical posture in a chemical liquid. As described above, the chemical liquid containing phosphoric acid, acetic acid, nitric acid and water is used in the etching processing, and the tungsten film 101 and the titanium nitride film 102 are etched by this etching processing.

As illustrated in FIG. 2, the substrate processing apparatus 1 according to the first exemplary embodiment includes a processing tub 10, a substrate holder 20, a chemical liquid supply 30, a circulation unit 40, an individual supply 50 and a control device 60.

(Processing Tub)

The processing tub 10 includes an inner tub 11 and an outer tub 12. The inner tub 11 is a box-shaped tub with an open top, and stores the chemical liquid therein. A lot formed by a plurality of wafers W is immersed in the inner tub 11. The outer tub 12 has an open top and is placed around an upper portion of the inner tub 11. The chemical liquid overflowed from the inner tub 11 is supplied into the outer tub 12.

(Substrate Holder 20)

The substrate holder 20 is configured to hold the plurality of wafers W in the vertical posture (longitudinally). Also, the substrate holder 20 holds the plurality of wafers W at a regular distance therebetween along a horizontal direction (here, Y-axis direction). The substrate holder 20 is connected to a non-illustrated elevating mechanism, and can move the plurality of wafers W between a processing position within the processing tub 10 and a standby position above the processing tub 10.

(Chemical Liquid Supply 30)

The chemical liquid supply 30 includes a chemical liquid source 31, a chemical liquid supply line 32 and a first valve 33. The chemical liquid source 31 supplies the chemical liquid containing phosphoric acid, acetic acid, nitric acid and water as components. Specifically, the chemical liquid source 31 supplies the chemical liquid in which the components are mixed at a mixing ratio where the selectivity of the tungsten film 101 to the titanium nitride film 102 exceeds 1. In other words, the chemical liquid source 31 supplies the chemical liquid in which the components are mixed at a mixing ratio where the tungsten film 101 can be etched at the first etching rate (>the second etching rate).

The chemical liquid supply line 32 is connected to the chemical liquid source 31 and supplies the chemical liquid from the chemical liquid source 31 into the outer tub 12 of the processing tub 10. The first valve 33 is provided at the chemical liquid supply line 32, and opens or closes the chemical liquid supply line 32. The first valve 33 is electrically connected to a controller 61 to be described later to be opened or closed under the control of the controller 61.

(Circulation Unit 40)

The circulation unit 40 is configured to circulate the chemical liquid between the inner tub 11 and the outer tub 12. The circulation unit 40 includes a circulation line 41, a plurality of chemical liquid supply nozzles 42, a pump 43, a heater 44, a concentration meter 45 and a filter 46. The circulation unit 40 also includes a drain line 47 and a second valve 48.

The circulation line 41 connects the outer tub 12 and the inner tub 11. One end of the circulation line 41 is connected to the outer tub 12 and the other end of the circulation line 41 is connected to the plurality of chemical liquid supply nozzles 42 placed inside the inner tub 11.

The pump 43, the heater 44, the concentration meter 45 and the filter 46 are provided at the circulation line 41. The pump 43 sends the chemical liquid inside the outer tub 12 to the circulation line 41. The heater 44 heats the chemical liquid flowing in the circulation line 41 to a temperature suitable for the etching processing. The concentration meter 45 measures the concentration of the chemical liquid flowing in the circulation line 41. Specifically, the concentration meter 45 measures the concentrations of the respective components, i.e., phosphoric acid, acetic acid, nitric acid and water, in the chemical liquid. Further, the circulation unit 40 may include a plurality of concentration meters, specifically a concentration meter for measuring the concentration of phosphoric acid, a concentration meter for measuring the concentration of acetic acid, a concentration meter for measuring the concentration of nitric acid and a concentration meter for measuring the concentration of water. The filter 46 removes impurities from the chemical liquid flowing in the circulation line 41.

The drain line 47 is a flow path branched from the circulation line 41 between the concentration meter 45 and the filter 46 and drains out the chemical liquid flowing in the circulation line 41 to the outside of the substrate processing apparatus 1. The drained chemical liquid has been heated by the heater 44. For this reason, the drain line 47 may include a cooling unit configured to cool the heated chemical liquid.

The second valve 48 is provided at the drain line 47, and opens or closes the drain line 47.

The chemical liquid stored in the outer tub 12 is supplied from the plurality of chemical liquid supply nozzles 42 into the inner tub 11 through the circulation line 41. The chemical liquid supplied into the inner tub 11 overflows from the inner tub 11 and flows back to the outer tub 12. As such, the chemical liquid is circulated between the inner tub 11 and the outer tub 12.

The pump 43, the heater 44 and the second valve 48 are electrically connected to the controller 61 to be controlled by the controller 61. Also, the concentration meter 45 is electrically connected to the controller 61 and outputs a measurement result of the concentration to the controller 61.

(Individual Supply 50)

The individual supply 50 includes a water source 51a, a phosphoric acid source 51b, an acetic acid source 51c, a nitric acid source 51d, a water supply line 52a, a phosphoric acid supply line 52b, an acetic acid supply line 52c, a nitric acid supply line 52d and third to sixth valves 53a to 53d.

The water source 51a supplies water. The water supplied from the water source 51a is, for example, deionized water. The water supply line 52a is connected to the water source 51a and supplies the water from the water source 51a into the outer tub 12 of the processing tub 10. The third valve 53a is provided at the water supply line 52a, and opens or closes the water supply line 52a. The third valve 53a is electrically connected to the controller 61 to be opened or closed under the control of the controller 61.

The phosphoric acid source 51b supplies phosphoric acid. The phosphoric acid supply line 52b is connected to the phosphoric acid source 51b and supplies the phosphoric acid from the phosphoric acid source 51b into the outer tub 12. The fourth valve 53b is provided at the phosphoric acid supply line 52b, and opens or closes the phosphoric acid supply line 52b. The fourth valve 53b is electrically connected to the controller 61 to be opened or closed under the control of the controller 61.

The acetic acid source 51c supplies acetic acid. The acetic acid supply line 52c is connected to the acetic acid source 51c and supplies the acetic acid from the acetic acid source 51c into the outer tub 12. The fifth valve 53c is provided at the acetic acid supply line 52c, and opens or closes the acetic acid supply line 52c. The fifth valve 53c is electrically connected to the controller 61 to be opened or closed under the control of the controller 61.

The nitric acid source 51d supplies nitric acid. The nitric acid supply line 52d is connected to the nitric acid source 51d and supplies the nitric acid from the nitric acid source 51d into the outer tub 12. The sixth valve 53d is provided at the nitric acid supply line 52d, and opens or closes the nitric acid supply line 52d. The sixth valve 53d is electrically connected to the controller 61 to be opened or closed under the control of the controller 61.

The third to sixth valves 53a to 53d are electrically connected to the controller 61 to be opened or closed under the control of the controller 61.

(Control Device 60)

The control device 60 is, for example, a computer and includes the controller 61 and a storage 62. The storage 62 is implemented by a semiconductor memory device such as a RAM, a flash memory or the like, or a storage device such as a hard disk, an optical disk or the like and stores therein a program for controlling various processings performed by the substrate processing apparatus 1. The controller 61 includes a microcomputer composed of a central processing unit (CPU), a read only memory (ROM), a random access memory (RAM), an input/output port and the like or various circuits. The controller 61 controls the operations of the substrate processing apparatus 1 by reading the program stored in the storage 62 and executing the program.

The program may be recorded in a computer-readable recording medium and thus may be installed into the storage 62 of the control device 60 from the recording medium. The computer-readable recording medium includes, for example, a hard disk (HD), a flexible disk (FD), a compact disk (CD), a magneto-optical disk (MO), and a memory card.

(Specific Operations of Substrate Processing Apparatus 1)

Figure 3:
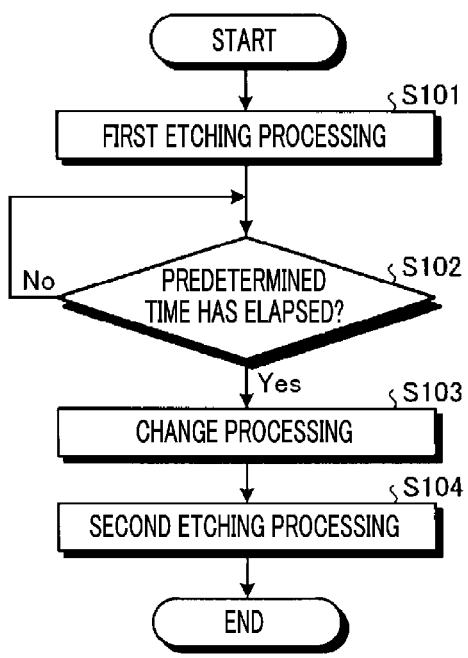
FIG. 3 is a flowchart showing a processing sequence performed by the substrate processing apparatus according to the first exemplary embodiment.

Hereinafter, specific operations of the substrate processing apparatus 1 according to the first exemplary embodiment will be described with reference to FIG. 3 and FIG. 4. FIG. 3 is a flowchart showing the processing sequence performed by the substrate processing apparatus 1 according to the first exemplary embodiment. FIG. 4 is a diagram provided to explain a change processing according to the first exemplary embodiment.

As shown in FIG. 3, in the substrate processing apparatus 1, the first etching processing is performed (process S101). In the first etching processing, the controller 61 controls a non-illustrated substrate transfer device configured to transfer a plurality of wafers W to deliver the plurality of wafers W to the substrate holder 20. Then, the controller 61 controls the non-illustrated elevating mechanism to lower the substrate holder 20 so that the plurality of wafers W can be immersed in the chemical liquid stored in the processing tub 10.

In the first etching processing, the chemical liquid supplied from the chemical liquid supply 30, i.e., the chemical liquid in which the components are mixed at a mixing ratio where the selectivity of the tungsten film 101 to the titanium nitride film 102 exceeds 1, is stored in the processing tub 10. Thus, the tungsten film 101 formed on the plurality of wafers W is etched in a short time at the first etching rate that is higher than the second etching rate at which the tungsten film 101 is etched in the following second etching processing.

As illustrated in FIG. 4, in the first etching processing, the controller 61 controls the opening/closing of the third valve 53a at the water supply line 52a, the fifth valve 53c at the acetic acid supply line 52c and the sixth valve 53d at the nitric acid supply line 52d based on, for example, the measurement result from the concentration meter 45. Accordingly, water, acetic acid and nitric acid are supplemented to the processing tub 10, and, thus, the concentration of the chemical liquid inside the processing tub 10 can be maintained constant.

Then, the controller 61 determines whether a predetermined time has elapsed after, for example, the start of the first etching processing (process S102). The predetermined time is set to be shorter than, for example, a time obtained by deducting a time required for changing the etching rate of the tungsten film 101 from the first etching rate to the second etching rate from a time required for the first etching processing. The controller 61 repeats the determination of the process S102 until the predetermined time has elapsed (process S102, No).

If it is determined in the process S102 that the predetermined time has elapsed (process S102, Yes), the controller 61 starts the change processing (process S103).

In the change processing, the controller 61 opens the second valve 48 to drain the chemical liquid flowing in the circulation line 41 from the drain line 47 to the outside of the substrate processing apparatus 1. Also, the controller 61 closes the third valve 53a and the fifth valve 53c to stop the supply of water and acetic acid into the processing tub 10 and opens the fourth valve 53b and the sixth valve 53d to supply phosphoric acid and nitric acid into the processing tub 10.

By stopping the supply of water into the processing tub 10, the concentration of water in the chemical liquid stored in the processing tub 10 is lowered. As a result, the etching rate of the tungsten film 101 is lowered from the first etching rate to the second etching rate, and, thus, the selectivity between the tungsten film 101 and the titanium nitride film 102 is changed to 1:1.

As described above, in the substrate processing apparatus 1, an etching rate of the tungsten film 101 is lowered from the first etching rate to the second etching rate by changing the mixing ratios of the components contained in the chemical liquid. Accordingly, the tungsten film 101 can be etched at the first etching rate in a short time during the first etching processing, and the tungsten film 101 and the titanium nitride film 102 can be etched with the selectivity of 1:1 during the second etching processing.

Also, in the substrate processing apparatus 1, the etching rate of the tungsten film 101 is lowered from the first etching rate to the second etching rate by lowering the mixing ratio of water among the plurality of components contained in the chemical liquid. As described above, the etching rate of the tungsten film 101 can easily increase as the ratio of water, compared with the other components, in the chemical liquid increases. For this reason, the etching rate of the tungsten film 101 can be lowered in a short time by lowering the mixing ratio of water compared with a case where the mixing ratio of another component is changed.

Further, in the substrate processing apparatus 1, some of the chemical liquid is drained from the processing tub 10, and a new liquid (here, a chemical liquid containing phosphoric acid and nitric acid) having a lower mixing ratio of water than the drained chemical liquid is supplied into the processing tub 10 to lower the etching rate of the tungsten film 101. As such, the mixing ratio of water can be lowered in a shorter time by draining the chemical liquid having a higher concentration of water from the processing tub 10. That is, the etching rate of the tungsten film 101 can be lowered in a shorter time.

Then, in the substrate processing apparatus 1, the second etching processing is performed (process S104). In the second etching processing, the chemical liquid for etching the tungsten film 101 and the titanium nitride film 102 with the selectivity of 1:1 is supplied onto the wafer W on which the tungsten film 101 and the titanium nitride film 102 are exposed. Accordingly, the tungsten film 101 and the titanium nitride film 102 are etched at the same etching rate (second etching rate). After the second etching processing is ended, the controller 61 ends the series of substrate processings.

Also, as illustrated in FIG. 4, in the second etching processing, the controller 61 controls the opening/closing of the third valve 53a, the fifth valve 53c and the sixth valve 53d as in the first etching processing, and, thus, the concentration of the chemical liquid inside the processing tub 10 can be maintained constant.

Second Exemplary Embodiment

Figure 5:
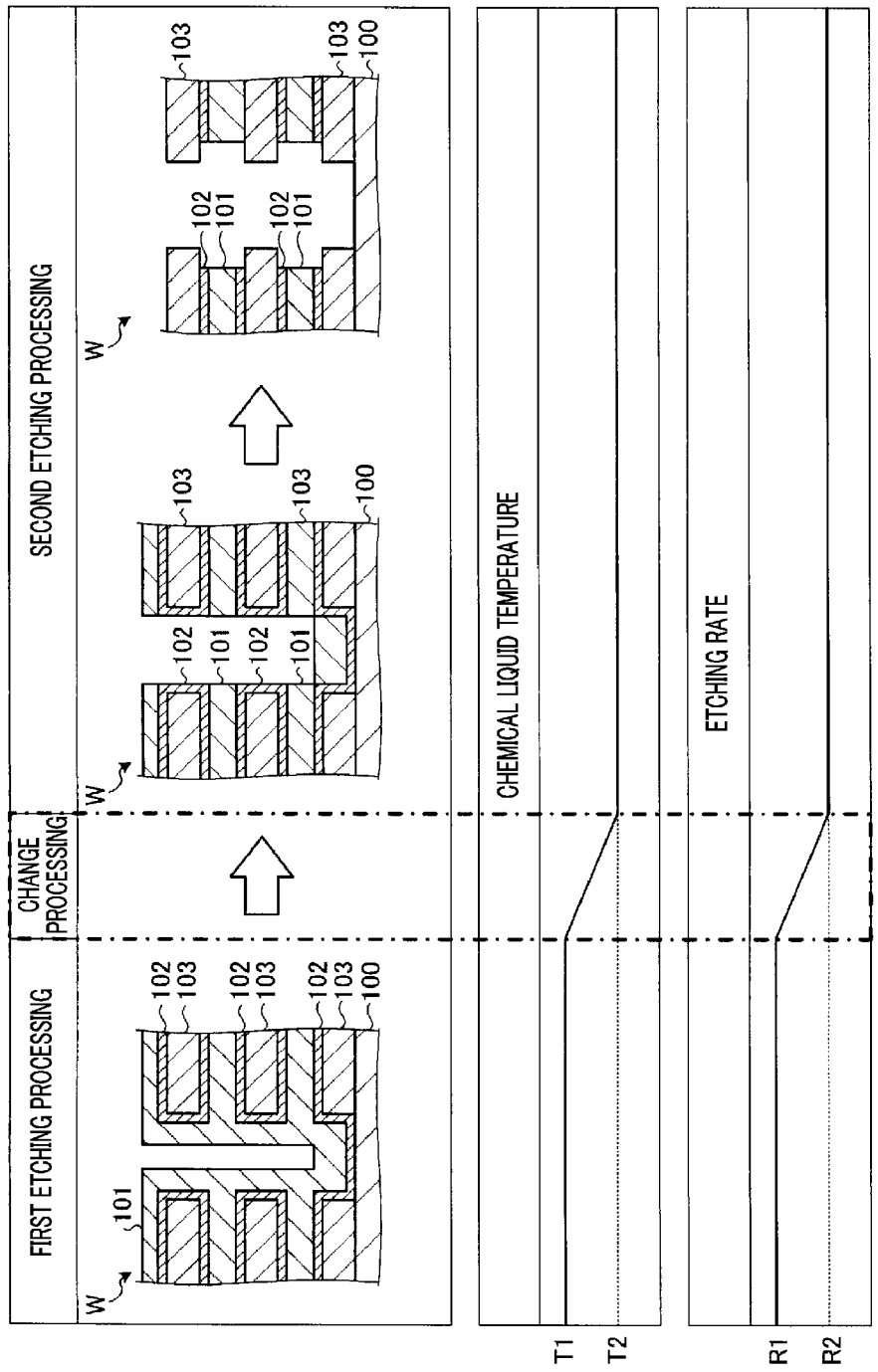
FIG. 5 is a diagram provided to explain a substrate processing according to a second exemplary embodiment.

Hereinafter, a substrate processing according to a second exemplary embodiment will be described with reference to FIG. 5. FIG. 5 is a diagram provided to explain the substrate processing according to the second exemplary embodiment. As illustrated in FIG. 5, in the change processing of the substrate processing according to the second exemplary embodiment, a temperature of the chemical liquid is lowered. Accordingly, etching rates of the tungsten film 101 and the titanium nitride film 102 are lowered from a first etching rate R1 in the first etching processing to a second etching rate R2 in the second etching processing.

A chemical liquid is dependent on a temperature, and, thus, as the temperature of the chemical liquid increases, the etching rates of the tungsten film 101 and the titanium nitride film 102 tend to increase. Therefore, in the first etching processing before the change processing, the chemical liquid having a relatively high first temperature T1 is supplied to the wafer W, and, thus, the tungsten film 101 can be etched at the relatively high first etching rate R1. That is, in the first etching processing, the tungsten film 101 can be etched in a relatively short time.

Further, in the second etching processing after the change processing, the chemical liquid having a second temperature T2 lower than the first temperature T1 is supplied to the wafer W. For this reason, the tungsten film 101 and the titanium nitride film 102 are etched at the second etching rate R2 lower than the first etching rate R1. Accordingly, for example, in the second etching processing, it is possible to suppress the tungsten film 101 and the titanium nitride film 102 from being over-etched. Also, after the second etching processing, it is possible to suppress surface roughness of the tungsten film 101 and the titanium nitride film 102.

As described above, in the change processing of the substrate processing according to the second exemplary embodiment, the temperature of the chemical liquid is changed from the first temperature T1 to the second temperature T2 lower than the first temperature T1 to decrease the etching rate from the first etching rate R1 to the second etching rate R2. Therefore, in the substrate processing according to the second exemplary embodiment, the processing time required for the first etching processing can be reduced and the processing accuracy of the second etching processing can be improved. Also, a temperature difference between the first temperature T1 and the second temperature T2 is, for example, about 5° C. or less. The substrate processing apparatus 1 may include a temperature measurement device configured to measure the temperature of the chemical liquid in the processing tub 10 or the circulation unit 40, and the controller 61 may control the temperature of the chemical liquid based on the measurement result from the temperature measurement unit.

The present inventors have discovered that a change in the selectivity between the tungsten film 101 and the titanium nitride film 102 is small when the temperature of the chemical liquid is changed. As such, even when the temperature of the chemical liquid is changed, the selectivity between the tungsten film 101 and the titanium nitride film 102 is little changed, and, thus, there is no need to change the mixing ratio of the chemical liquid, for example, to maintain the selectivity of 1:1. Therefore, it is possible to easily control the selectivity.

Further, in the second exemplary embodiment, the chemical liquid source 31 of the chemical liquid supply 30 supplies a chemical liquid in which components are mixed for the selectivity of 1:1 between the tungsten film 101 and the titanium nitride film 102. Accordingly, in the second exemplary embodiment, the chemical liquid for the selectivity of 1:1 between the tungsten film 101 and the titanium nitride film 102 can be stored in the processing tub 10.

Furthermore, in the second exemplary embodiment, the controller 61 stops, for example, the operation of the heater 44 in the change processing to lower the temperature of the chemical liquid stored in the processing tub 10. However, the present disclosure is not limited thereto. In the second exemplary embodiment, the substrate processing apparatus 1 may further include a non-illustrated cooling unit at the circulation line 41. In this case, the controller 61 may stop the operation of the heater 44 and operate the non-illustrated cooling unit in the change processing to lower the temperature of the chemical liquid stored in the processing tub 10. By actively cooling the chemical liquid with the cooling unit, it is possible to reduce the time required for the change processing. For example, a cooling coil or a cooling jacket may be used as the cooling unit.

Moreover, in the change processing of the first exemplary embodiment, the controller 61 may control the heater 44 or the non-illustrated cooling unit to change the temperature of the chemical liquid as in the change processing of the second exemplary embodiment. Accordingly, it is possible to further reduce the time required for, e.g., the first etching processing. Further, it is possible to further improve the processing accuracy of the second etching processing.

Third Exemplary Embodiment

Figure 6:
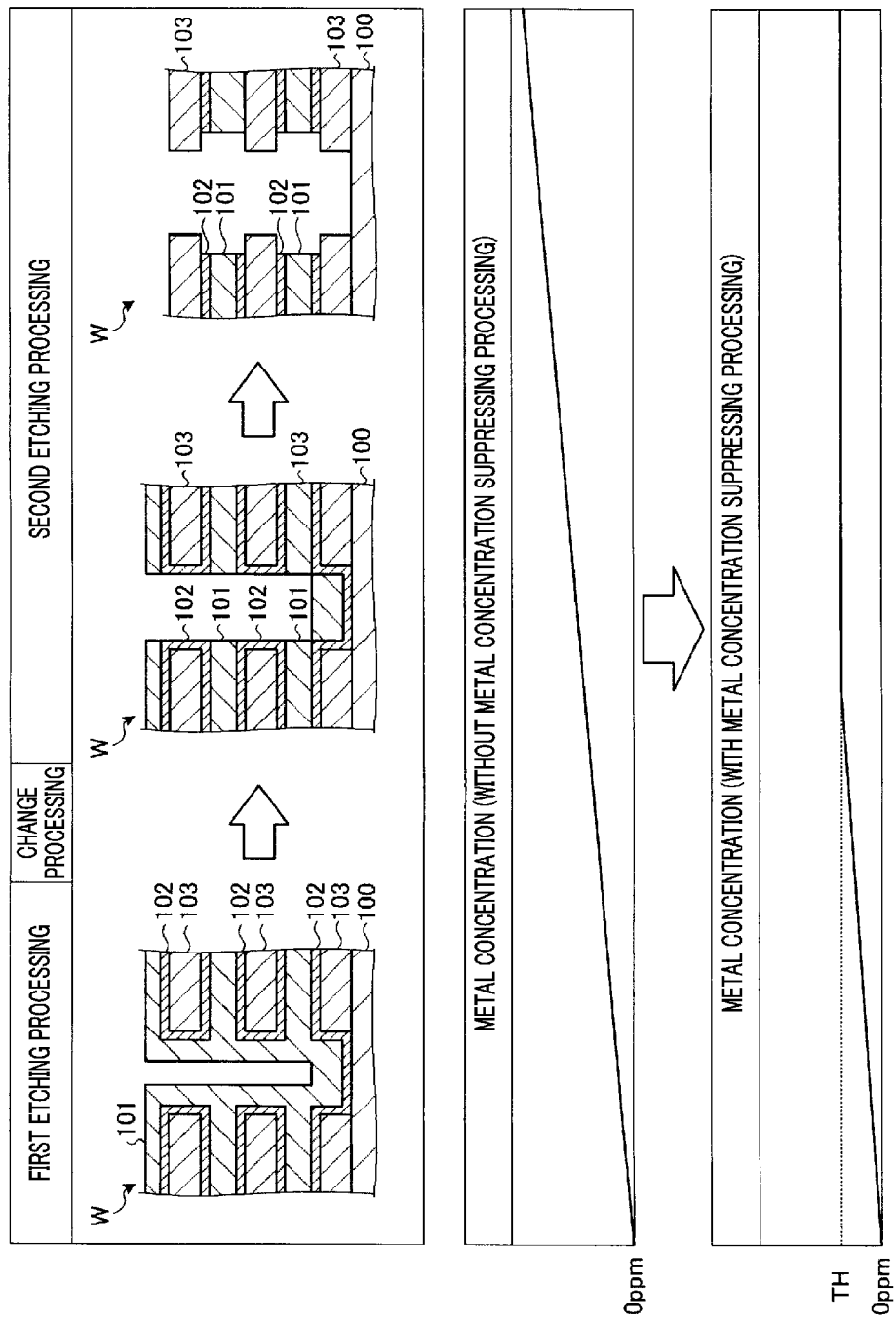
FIG. 6 is a diagram provided to explain a substrate processing according to a third exemplary embodiment.

Hereinafter, a substrate processing according to a third exemplary embodiment will be described with reference to FIG. 6. FIG. 6 is a diagram provided to explain the substrate processing according to the third exemplary embodiment.

When the first etching processing or the second etching processing is performed, a metal such as tungsten contained in the tungsten film 101 or titanium contained in the titanium nitride film 102 is dissolved in the chemical liquid, and, thus, a metal concentration in the chemical liquid gradually increases. If the etching processing is performed with a chemical liquid having a high metal concentration, for example, the etching rate may be changed or electrical characteristics of a product wafer may be affected. Therefore, it is desirable to suppress the increase in the metal concentration in the chemical liquid.

Here, whenever the series of substrate processings are ended, all the chemical liquid in the processing tub 10 may be drained and replaced with a new chemical liquid not containing metal to suppress the increase in the metal concentration. However, this method is not desirable in terms of reduction in the consumption amount of the chemical liquid or in terms of reduction in the time required for the chemical liquid replacement.

Therefore, as illustrated in FIG. 6, the controller 61 may perform a metal concentration suppressing processing for suppressing the increase in the metal concentration in the chemical liquid in order for the metal concentration not to exceed a threshold TH in the series of substrate processings.

Specifically, the controller 61 drains some of the chemical liquid in the processing tub 10 through the drain line 47 and supplies a new chemical liquid not containing the metal into the processing tub 10 from the chemical liquid supply 30 in the series of substrate processings. As such, by replacing some of the chemical liquid containing the metal with the new chemical liquid not containing the metal in the series of substrate processings, it is possible to suppress the increase in the metal concentration in the chemical liquid. The metal concentration suppressing processing is performed in the series of substrate processings, and, thus, it is possible to reduce the time required for the chemical liquid replacement. Also, not all but some of the chemical liquid is replaced with the new chemical liquid, and, thus, it is possible to suppress the consumption amount of the chemical liquid.

The controller 61 may start the metal concentration suppressing processing when a predetermined time has elapsed after, for example, the start of the first etching processing. Herein, the predetermined time refers to, for example, a time period until the metal concentration in the chemical liquid inside the processing tub 10 reaches the threshold TH from 0 ppm, and is calculated in advance by experiment. Also, in a state where the chemical liquid containing the metal (whose metal concentration equals to the threshold TH) is stored in the processing tub 10, the series of substrate processings may be started. In this case, the controller 61 may start the first etching processing and the metal concentration suppressing processing at the same time.

Further, a change rate in the metal concentration over time may be calculated by experiment. The controller 61 may control the second valve 48 and the first valve 33 based on this information to replace the chemical liquid in an appropriate amount at an appropriate time so that the metal concentration in the chemical liquid falls within a threshold range around the threshold TH.

Fourth Exemplary Embodiment

Figure 7:
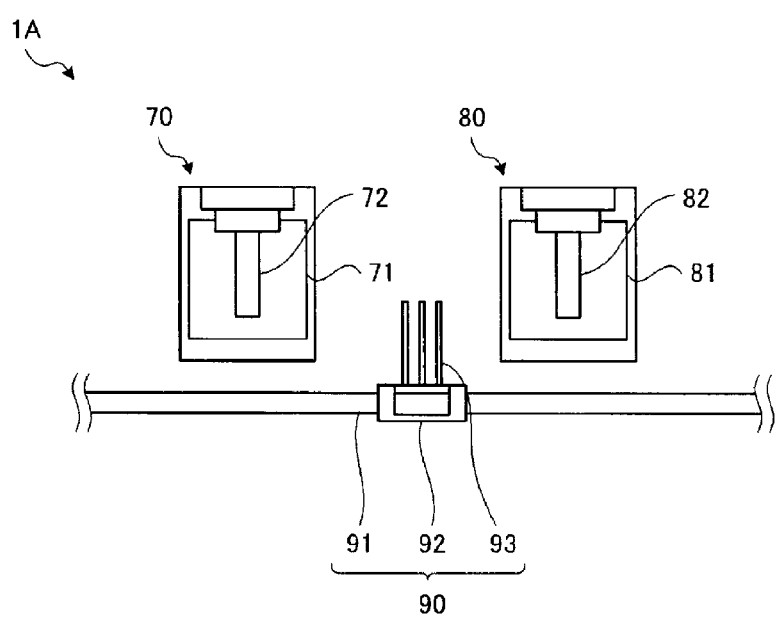
FIG. 7 is a diagram illustrating a configuration of a substrate processing apparatus according to a fourth exemplary embodiment.

In the above-described exemplary embodiments, the first etching processing and the second etching processing are performed in the single processing tub 10, but the first etching processing and the second etching processing may be performed in different processing tubs, respectively. FIG. 7 is a diagram illustrating a configuration of a substrate processing apparatus according to a fourth exemplary embodiment.

As illustrated in FIG. 7, a substrate processing apparatus 1A according to the fourth exemplary embodiment includes a first etching processing apparatus 70, a second etching processing apparatus 80 and a transfer apparatus 90.

The first etching processing apparatus 70 includes a processing tub 71 (hereinafter, referred to as "first processing tub 71") for the first etching processing and a substrate elevating mechanism 72. Further, the second etching processing apparatus 80 includes a processing tub 81 (hereinafter, referred to as "second processing tub 81") for the second etching processing and a substrate elevating mechanism 82.

The processing tubs 71 and 81 can accommodate wafers W corresponding to a single lot. The first processing tub 71 stores therein a chemical liquid (hereinafter, referred to as "first chemical liquid") having a first etching rate. Further, the second processing tub 81 stores therein a chemical liquid (hereinafter, referred to as "second chemical liquid") having a second etching rate.

The substrate elevating mechanisms 72 and 82 deliver the lot to the transfer apparatus 90 to be described later. Also, the substrate elevating mechanisms 72 and 82 lower the lot to immerse the lot in the processing tubs 71 and 81, respectively. Further, the substrate elevating mechanisms 72 and 82 lift the lot to raise the lot from the processing tubs 71 and 81, respectively.

The first etching processing apparatus 70 performs the first etching processing by immersing the lot in the first chemical liquid stored in the first processing tub 71. Further, the second etching processing apparatus 80 performs the second etching processing by immersing the lot in the second chemical liquid stored in the second processing tub 81.

The transfer apparatus 90 transfers the lot between the first etching processing apparatus 70 and the second etching processing apparatus 80. The transfer apparatus 90 includes a rail 91, a moving body 92 and a substrate holder 93. The rail 91 extends along an arrangement direction of the first etching processing apparatus 70 and the second etching processing apparatus 80. The moving body 92 is configured to be movable along the rail 91 while holding a plurality of wafers W. The substrate holder 93 is provided on the moving body 92 and holds the plurality of wafers W arranged back and forth in a standing posture.

Figure 8:
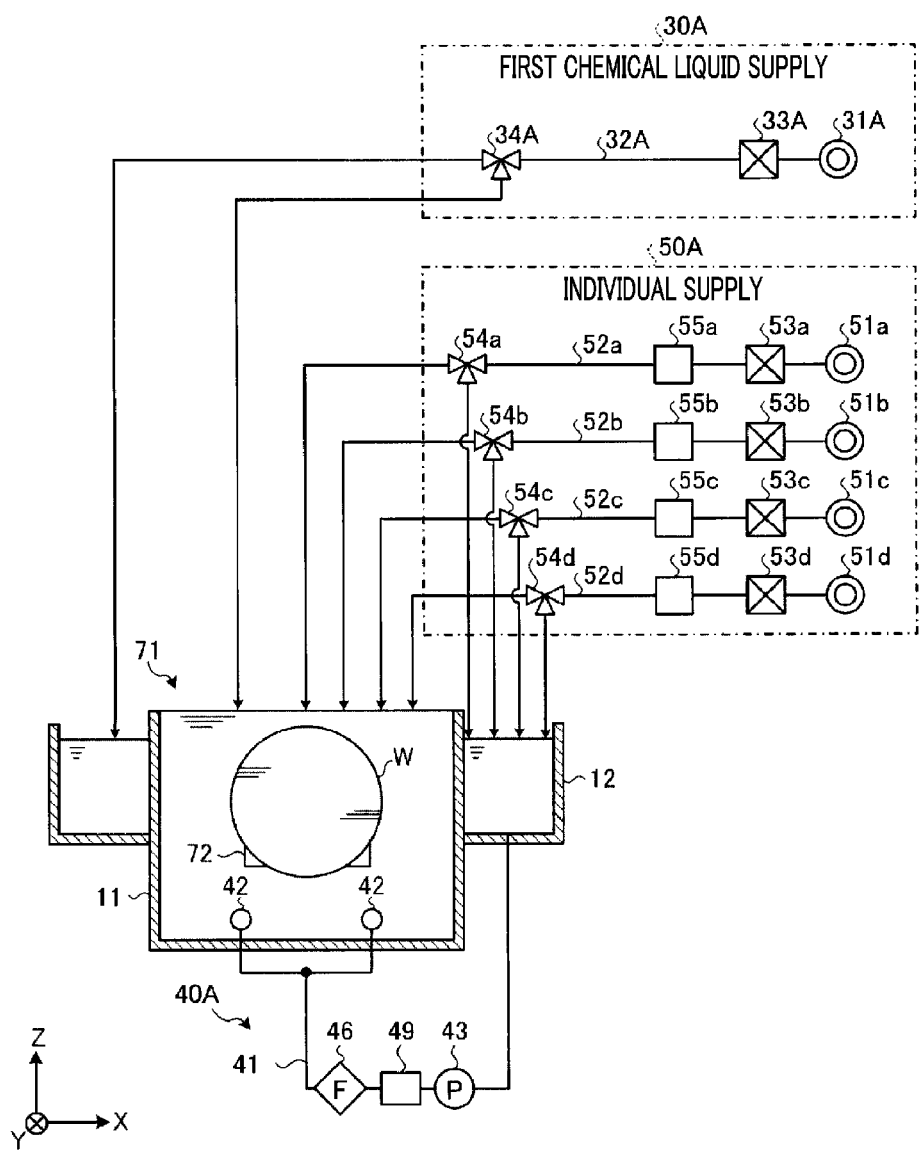
FIG. 8 is a diagram illustrating a configuration of a first processing tub according to the fourth exemplary embodiment.
Figure 9:
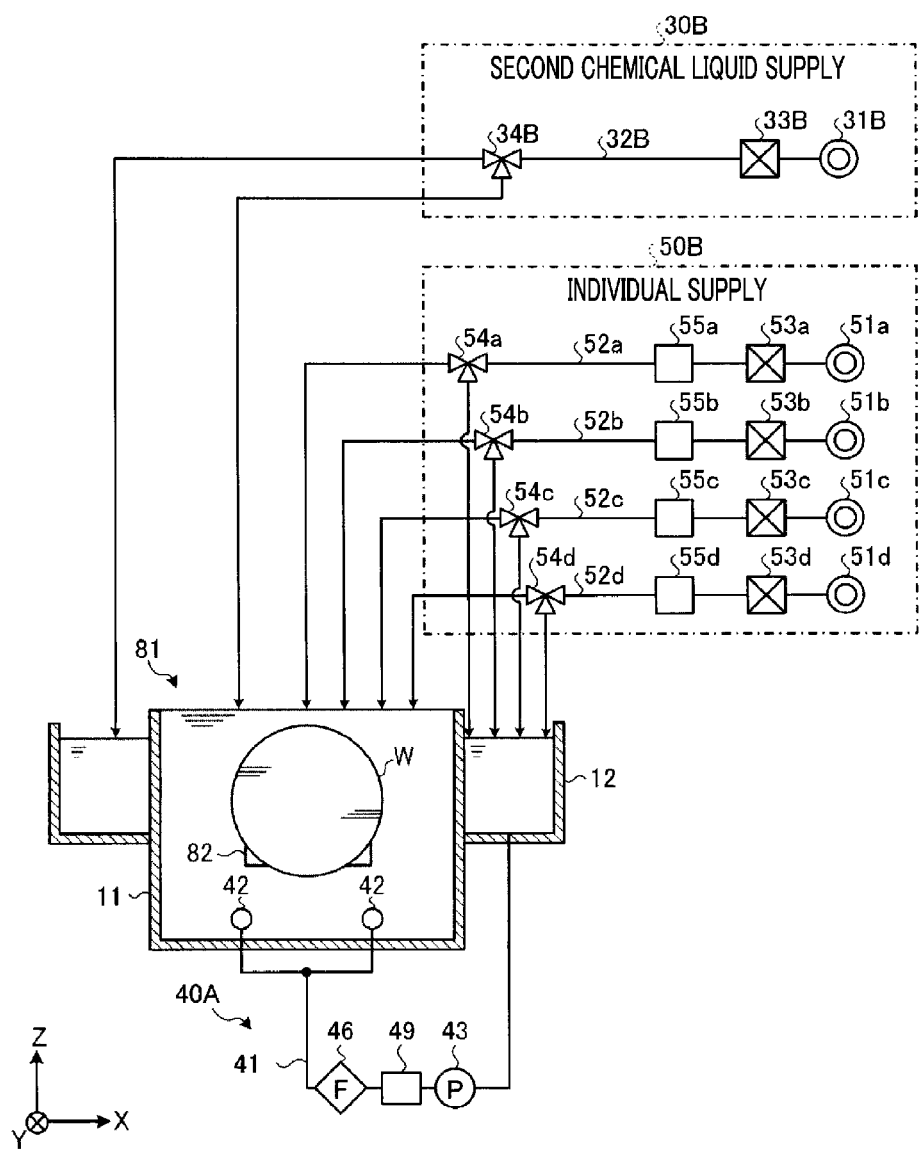
FIG. 9 is a diagram illustrating a configuration of a second processing tub according to the fourth exemplary embodiment.

Hereinafter, configurations of the first processing tub 71 and the second processing tub 81 will be described with reference to FIG. 8 and FIG. 9, respectively. FIG. 8 is a diagram illustrating a configuration of the first processing tub 71 according to the fourth exemplary embodiment. Further, FIG. 9 is a diagram illustrating a configuration of the second processing tub 81 according to the fourth exemplary embodiment.

As illustrated in FIG. 8, the first processing tub 71 includes the inner tub 11 and the outer tub 12 like the above-described processing tub 10 (see FIG. 2).

The first processing tub 71 includes a circulation unit 40A. The circulation unit 40A circulates the processing liquid between the inner tub 11 and the outer tub 12. The circulation unit 40A includes the circulation line 41, the nozzles 42, the pump 43, the filter 46 and a temperature controller 49.

The circulation line 41 connects the inner tub 11 and the outer tub 12. One end of the circulation line 41 is connected to the outer tub 12 and the other end of the circulation line 41 is connected to the nozzles 42 placed inside the inner tub 11.

The pump 43, the filter 46 and the temperature controller 49 are provided at the circulation line 41. The pump 43 sends the first chemical liquid inside the outer tub 12 to the circulation line 41. The filter 46 removes impurities from the first chemical liquid flowing in the circulation line 41.

The temperature controller 49 is, for example, a heater or an electronic thermostat, and controls a temperature of the first chemical liquid flowing in the circulation line 41 to a predetermined temperature. The pump 43 and the temperature controller 49 are controlled by the controller 61.

Further, the first processing tub 71 includes a first chemical liquid supply 30A. The first chemical liquid supply 30A includes a first chemical liquid source 31A, a first chemical liquid supply line 32A, a first valve 33A and a first switching unit 34A.

The first chemical liquid source 31A supplies the first chemical liquid. The first chemical liquid contains phosphoric acid, acetic acid, nitric acid and water as components, and the components are mixed at a mixing ratio where the tungsten film 101 (see FIG. 1) can be etched at the first etching rate (>the second etching rate).

The first chemical liquid supply line 32A is connected to the first chemical liquid source 31A and supplies the first chemical liquid from the first chemical liquid source 31A into the inner tub 11 or the outer tub 12 of the first processing tub 71. The first valve 33A is provided at the first chemical liquid supply line 32A, and opens or closes the first chemical liquid supply line 32A. The first switching unit 34A is provided at the first chemical liquid supply line 32A and switches a flow destination of the first chemical liquid flowing in the first chemical liquid supply line 32A between the inner tub 11 and the outer tub 12.

The first valve 33A and the first switching unit 34A are electrically connected to the controller 61 to be controlled by the controller 61. For example, to store the first chemical liquid in the first processing tub 71 in an empty state, the controller 61 controls the first valve 33A and the first switching unit 34A to supply a new first chemical liquid into the inner tub 11 from the first chemical liquid source 31A. Also, to supplement the first chemical liquid to the first processing tub 71, the controller 61 controls the first valve 33A and the first switching unit 34A to supply a new first chemical liquid into the outer tub 12 from the first chemical liquid source 31A.

Further, the first processing tub 71 includes an individual supply 50A. The individual supply 50A includes third to sixth switching units 54a to 54d in addition to the above-described individual supply 50. The third switching unit 54a is provided at the water supply line 52a and switches a flow destination of water flowing in the water supply line 52a between the inner tub 11 and the outer tub 12. The fourth switching unit 54b is provided at the phosphoric acid supply line 52b and switches a flow destination of phosphoric acid flowing in the phosphoric acid supply line 52b between the inner tub 11 and the outer tub 12.

The fifth switching unit 54c is provided at the acetic acid supply line 52c and switches a flow destination of acetic acid flowing in the acetic acid supply line 52c between the inner tub 11 and the outer tub 12. The sixth switching unit 54d is provided at the nitric acid supply line 52d and switches a flow destination of nitric acid flowing in the nitric acid supply line 52d between the inner tub 11 and the outer tub 12.

Also, the individual supply 50A includes third to sixth flow rate controllers 55a to 55d in addition to the above-described individual supply 50. Each of the third to sixth flow rate controllers 55a to 55d includes a flow rate control valve, a flowmeter and the like.

The third flow rate controller 55a is provided at the water supply line 52a and controls a flow rate of water to be supplied into the inner tub 11 or the outer tub 12. The fourth flow rate controller 55b is provided at the phosphoric acid supply line 52b and controls a flow rate of phosphoric acid to be supplied into the inner tub 11 or the outer tub 12. The fifth flow rate controller 55c is provided at the acetic acid supply line 52c and controls a flow rate of acetic acid to be supplied into the inner tub 11 or the outer tub 12. The sixth flow rate controller 55d is provided at the nitric acid supply line 52d and controls a flow rate of nitric acid to be supplied into the inner tub 11 or the outer tub 12.

The third to sixth valves 53a to 53d, the third to sixth switching units 54a to 54d and the third to sixth flow rate controllers 55a to 55d are electrically connected to the controller 61 to be opened or closed under the control of the controller 61.

For example, to store a new first chemical liquid in the first processing tub 71 in an empty state, the controller 61 controls the third to sixth valves 53a to 53d and the third to sixth switching units 54a to 54d to supply water, phosphoric acid, acetic acid and nitric acid into the inner tub 11. Also, to supplement the first chemical liquid to the first processing tub 71, the controller 61 controls the third to sixth valves 53a to 53d and the third to sixth switching units 54a to 54d to supply water, phosphoric acid, acetic acid and nitric acid into the outer tub 12.

Hereinafter, a configuration of the second processing tub 81 will be described. As illustrated in FIG. 9, the second processing tub 81 includes the inner tub 11, the outer tub 12 and the circulation unit 40A which are the same as those of the above-described first processing tub 71.

Further, the second processing tub 81 includes a second chemical liquid supply 30B. The second chemical liquid supply 30B includes a second chemical liquid source 31B, a second chemical liquid supply line 32B and a first valve 33B.

The second chemical liquid source 31B supplies the second chemical liquid. The second chemical liquid contains phosphoric acid, acetic acid, nitric acid and water as components, and the components are mixed at a mixing ratio where the tungsten film 101 can be etched at the second etching rate (<the first etching rate).

The second chemical liquid supply line 32B is connected to the second chemical liquid source 31B and supplies the second chemical liquid from the second chemical liquid source 31B into the inner tub 11 or the outer tub 12 of the second processing tub 81. The first valve 33B is provided at the second chemical liquid supply line 32B, and opens or closes the second chemical liquid supply line 32B. A first switching unit 34B is provided at the second chemical liquid supply line 32B and switches a flow destination of the second chemical liquid flowing in the second chemical liquid supply line 32B between the inner tub 11 and the outer tub 12. The first valve 33B and the first switching unit 34B are electrically connected to the controller 61 to be controlled by the controller 61.

Further, the second processing tub 81 includes an individual supply 50B. The individual supply 50B has the same configuration as the above-described individual supply 50A, and, thus, a description thereof will be omitted herein.

In the substrate processing apparatus 1A according to the fourth exemplary embodiment, the first etching processing is first performed in the first processing tub 71. In the first etching processing, a plurality of wafers W is lowered by the substrate elevating mechanism 72 to be immersed in the first chemical liquid stored in the inner tub 11 of the first processing tub 71.

Then, in the substrate processing apparatus 1A, a transfer processing of transferring the plurality of wafers W on which the first etching processing has been completed to the second processing tub 81. In the transfer processing, as the substrate elevating mechanism 72 moves first upwards, the plurality of wafers W is raised from the first processing tub 71. Then, the plurality of wafers W is delivered from the substrate elevating mechanism 72 to the transfer apparatus 90. Thereafter, the transfer apparatus 90 moves from the first processing tub 71 to the second processing tub 81 to deliver the plurality of wafers W held thereon to the substrate elevating mechanism 82.

Then, in the second processing tub 81 of the substrate processing apparatus 1A, the second etching processing is performed. In the second etching processing, the plurality of wafers W is lowered by the substrate elevating mechanism 82 to be immersed in the second chemical liquid stored in the inner tub 11 of the second processing tub 81.

As described above, the first etching processing and the second etching processing may be performed in different processing tubs (the first processing tub 71 and the second processing tub 81), respectively.

Other Exemplary Embodiments

In the above-described exemplary embodiments, there has been described an example where a first film is the tungsten film 101, but the first film is not necessarily the tungsten film 101. For example, the first film may be a molybdenum film, an osmium film, an iridium film, a ruthenium film, a rhodium film, a copper film or a nickel film. By the substrate processing according to the above-described exemplary embodiments, the substrate having the first film such as a molybdenum film instead of the tungsten film 101 and a second film can be etched with high efficiency.

If the first film is the molybdenum film, the temperature of the chemical liquid (the first chemical liquid and the second chemical liquid) is desirably room temperature (e.g., 20° C.±10° C.) or less. Molybdenum is one of base metals and has high ionization tendency. Thus, it is relatively easily oxidized. For this reason, by using the chemical liquid having a temperature of room temperature or less, the molybdenum film at an excessively high etching rate can be suppressed from being over-etched.

If the first film is the molybdenum film and the etching rate of the chemical liquid is changed by lowering the temperature of the chemical liquid as in the second exemplary embodiment, the controller 61 may lower the temperature of the chemical liquid, for example, from 25° C. to 20° C. Further, the controller 61 may lower the temperature of the chemical liquid from room temperature (e.g., 25° C.) to a temperature less than room temperature (e.g., 5° C.). As such, by lowering the temperature of the chemical liquid to room temperature or less, it is possible to make the etching rate of the molybdenum film slower.

If the first film is the molybdenum film, the processing tub 10 does not necessarily have the water supply system (the water source 51a, the water supply line 52a and the third valve 53a). The same applies to the first processing tub 71 and the second processing tub 81.

Further, in the above-described exemplary embodiments, there has been described an example where the second film is the titanium nitride film 102, but the second film is not necessarily limited to the titanium nitride film 102. For example, the second film may be a tantalum nitride film. By the substrate processing according to the above-described exemplary embodiments, the substrate having the second film including any one of the titanium nitride film and the tantalum nitride film and the first film can be etched with high efficiency.

The types of films formed on the wafer W are not limited to the above-described exemplary embodiments. For example, in the first and second exemplary embodiments, there has been described an example where the chemical liquid containing multiple components is used, but the chemical liquid may contain a single component such as hydrofluoric acid. Furthermore, in the above-described first and second exemplary embodiments, there has been described an example where one film is covered by the other film, but a plurality of films may be exposed.

In the above-described exemplary embodiments, there has been described an example where the etching rate (the second etching rate) in the second etching processing is set to be lower than the etching rate (the first etching rate) in the first etching processing. However, the present disclosure is not limited thereto, and the etching rate (the second etching rate) in the second etching processing may be set to be higher than the etching rate (the first etching rate) in the first etching processing. For example, an unnecessary step formed on any one of the films may be etched in the first etching processing with high accuracy, and then, the films may be etched in a short time in the second etching processing. In this case, it is desirable to set the etching rate (the second etching rate) in the second etching processing to be higher than the etching rate (the first etching rate) in the first etching processing.

Further, in the above-described exemplary embodiments, there has been described an example where the multiple wafers W are etched all at once by immersing the multiple wafers W in the chemical liquid stored in the processing tub 10. However, the present disclosure is not limited thereto. For example, the wafer W may be held by a holder configured to rotatably hold a single wafer W, and the wafer W may be etched by supplying the chemical liquid from the nozzles placed above the holder to the wafer W being rotated.

Furthermore, in the above-described exemplary embodiments, there has been described an example where the etching, so-called wet etching, is performed on the wafer W with the chemical liquid, but the method of etching the wafer W is not limited to the wet etching, but may be dry etching.

As described above, the substrate processing method according to the exemplary embodiments includes a first etching process (e.g., the first etching processing), a change process (e.g., the change processing) and a second etching process (e.g., the second etching processing). In the first etching process, a substrate (e.g., a wafer W) having a first film (e.g., the tungsten film 101) and a second film (e.g., the titanium nitride film 102) is etched at a first etching rate. In the change process, an etching rate is changed from the first etching rate to a second etching rate. In the second etching process, the substrate is etched at the second etching rate.

Accordingly, for example, by setting the second etching rate to be lower than the first etching rate, it is possible to reduce the processing time required for the first etching processing and improve the processing accuracy of the second etching processing. Therefore, it is possible to etch a substrate having various types of films with high efficiency by the substrate processing method according to the exemplary embodiments.

The second etching rate may be lower than the first etching rate. Accordingly, it is possible to reduce the processing time required for the first etching processing and improve the processing accuracy of the second etching processing.

In the first etching process and the second etching process, the substrate may be etched by supplying a chemical liquid containing a plurality of components (e.g., phosphoric acid, acetic acid, nitric acid and water) to the substrate. In this case, in the change process, an etching rate may be lowered from the first etching rate to the second etching rate by changing the mixing ratios of the plurality of components. As such, it is possible to change the etching rate by changing the mixing ratios of the plurality of components in the chemical liquid.

The first film may be any one of a tungsten film (e.g., the tungsten film 101), a molybdenum film, an osmium film, an iridium film, a ruthenium film, a rhodium film, a copper film and a nickel film, and the second film may be any one of a titanium nitride film (e.g., the titanium nitride film 102) and a tantalum nitride film. Further, the chemical liquid may contain phosphoric acid, acetic acid, nitric acid and water. In this case, in the change process, an etching rate of the tungsten film may be lowered from the first etching rate to the second etching rate by changing a mixing ratio of water in the chemical liquid.

As such, the etching rate of the first film can be lowered in a short time by lowering the mixing ratio of water in the chemical liquid compared with a case where a mixing ratio of another component is changed.

In the first etching process and the second etching process, the substrate may be etched by immersing the substrate in the chemical liquid stored in a processing tub (e.g., the processing tub 10). In this case, in the change process, some of the chemical liquid may be drained from the processing tub and a new chemical liquid having a lower mixing ratio of water than the drained chemical liquid may be supplied into the processing tub to lower the etching rate from the first etching rate to the second etching rate.

As such, the mixing ratio of water can be lowered in a shorter time by draining the chemical liquid having a higher concentration of water from the processing tub. That is, the etching rate of the tungsten film can be lowered in a shorter time.

In the first etching process and the second etching process, the substrate may be etched by supplying the chemical liquid to the substrate. In this case, in the change process, a temperature of the chemical liquid may be changed from a first temperature to a second temperature lower than the first temperature to lower the etching rate from the first etching rate to the second etching rate. As such, the etching rate can be changed by changing the temperature of the chemical liquid.

The second film (e.g., the titanium nitride film 102) may be covered by the first film (e.g., the tungsten film 101). In this case, the first film may be etched at the first etching rate in the first etching process and the etching rate of the first film may be lowered from the first etching rate to the second etching rate in the change process before the second film is exposed through the first film.

Accordingly, for example, until the second film is exposed, the first film can be etched at a higher etching rate in a short time regardless of the selectivity between the first film and the second film. Further, after the second film is exposed, for example, the first film and the second film can be etched simultaneously with a desired selectivity (e.g., 1:1).

In the first etching process, the substrate may be immersed in a first processing tub that stores a first chemical liquid having the first etching rate as an etching rate. Further, in the second etching process, the substrate may be immersed in a second processing tub that stores a second chemical liquid having the second etching rate as an etching rate. Furthermore, in the change process, the substrate may be moved from the first processing tub to the second processing tub to lower an etching rate from the first etching rate to the second etching rate. Accordingly, the first etching processing and the second etching processing can be performed on the substrate without, for example, liquid replacement.

Further, a substrate processing apparatus (e.g., the substrate processing apparatus 1) according to the exemplary embodiments includes a supply (e.g., the chemical liquid supply 30 and the individual supply 50), a change unit (e.g., the second valve 48, the individual supply 50, the heater 44 and the non-illustrated cooling unit) and a controller (e.g., the controller 61). The supply supplies the chemical liquid to the substrate (e.g., a wafer W) having the first film (e.g., the tungsten film 101) and the second film (e.g., the titanium nitride film 102). The change unit changes supply conditions of the chemical liquid (e.g., the mixing ratios of the respective components in the chemical liquid, the temperature of the chemical liquid) supplied from the supply. The controller performs the first etching processing of etching the substrate using the chemical liquid at the first etching rate, the change processing of changing an etching rate from the first etching rate to the second etching rate by controlling the change unit and the second etching processing of etching the substrate using the chemical liquid at the second etching rate. Accordingly, the substrate having various types of films can be etched with high efficiency.

The chemical liquid may contain a plurality of components (e.g., phosphoric acid, acetic acid, nitric acid and water). In this case, the change unit (e.g., the second valve 48 and the individual supply 50) may change mixing ratios of the plurality of components in the chemical liquid. Further, the controller may control the change unit to change the mixing ratios of the plurality of components and lower the etching rate from the first etching rate to the second etching rate. As such, it is possible to change the etching rate by changing the mixing ratios of the plurality of components in the chemical liquid.

The change unit (e.g., the heater 44 and the non-illustrated cooling unit) may change a temperature of the chemical liquid. In this case, the controller may control the change unit to change the temperature of the chemical liquid from the first temperature to the second temperature lower than the first temperature and lower the etching rate from the first etching rate to the second etching rate. As such, it is possible to change the etching rate by changing the temperature of the chemical liquid.

A substrate processing apparatus (e.g., the substrate processing apparatus 1A) according to the exemplary embodiments may include a first processing tub (e.g., the first processing tub 71) and a second processing tub (e.g., the second processing tub 81). The first processing tub stores, as a chemical liquid, the first chemical liquid having the first etching rate as an etching rate. The second processing tub stores, as a chemical liquid, the second chemical liquid having the second etching rate as an etching rate. Also, the supply may include a first chemical liquid supply and a second chemical liquid supply. The first chemical liquid supply supplies the first chemical liquid into the first processing tub. The second chemical liquid supply supplies the second chemical liquid into the second processing tub. In this case, the change unit may be a moving mechanism (e.g., the transfer apparatus 90) that moves the substrate from the first processing tub to the second processing tub. Accordingly, the first etching processing and the second etching processing can be performed on the substrate without, for example, liquid replacement.

According to the exemplary embodiments, it is possible to etch the substrate having various types of films with high efficiency.

The exemplary embodiments disclosed herein are illustrative in all aspects and not limited thereto. In fact, the above exemplary embodiments can be embodied in various forms. Further, the above-described exemplary embodiments may be omitted, substituted, or changed in various forms without departing from the scope of the appended claims.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing method, comprising:
    etching a substrate having a first film and a second film at a first etching rate, the second film being covered by the first film;
    changing an etching rate from the first etching rate to a second etching rate before the second film is exposed through the first film; and etching the substrate at the second etching rate, wherein, in the etching of the substrate at the first etching rate and the etching of the substrate at the second etching rate, the substrate is etched by supplying a chemical liquid to the substrate, and in the changing of the etching rate, the etching rate of the first film is changed from the first etching rate to the second etching rate by lowering a mixing ratio of water in the chemical liquid by stopping a supply of the water to processing tub in which the etching is performed, wherein the second etching rate is lower than the first etching rate.

2. The substrate processing method of claim 1, wherein the first film is any one of a tungsten film, a molybdenum film, an osmium film, an iridium film, a ruthenium film, a rhodium film, a copper film and a nickel film, the second film is any one of a titanium nitride film and a tantalum nitride film, the chemical liquid contains phosphoric acid, acetic acid, nitric acid and water.

3. The substrate processing method of claim 2, in the etching of the substrate at the first etching rate, the first film is etched at the first etching rate, and in the changing of the etching rate, the etching rate of the first film is lowered from the first etching rate to the second etching rate before the second film is exposed through the first film.

4. The substrate processing method of claim 1, in the etching of the substrate at the first etching rate, the first film is etched at the first etching rate, and in the changing of the etching rate, the etching rate of the first film is lowered from the first etching rate to the second etching rate before the second film is exposed through the first film.

5. The substrate processing method of claim 1, wherein, in the changing of the etching rate, the etching rate is lowered from the first etching rate to the second etching rate by changing a temperature of the chemical liquid from a first temperature to a second temperature lower than the first temperature.

6. The substrate processing method of claim 5, in the etching of the substrate at the first etching rate, the first film is etched at the first etching rate, and in the changing of the etching rate, the etching rate of the first film is lowered from the first etching rate to the second etching rate before the second film is exposed through the first film.

7. A substrate processing method, comprising:

etching a substrate having a first film and a second film at a first etching rate, the second film being covered by the first film;

changing an etching rate from the first etching rate to a second etching rate before the second film is exposed through the first film; and etching the substrate at the second etching rate, wherein, in the etching of the substrate at the first etching rate and the etching of the substrate at the second etching rate, the substrate is etched by immersing the substrate in a chemical liquid stored in a processing tub, and in the changing of the etching rate, the etching rate is lowered from the first etching rate to the second etching rate by draining some of the chemical liquid from the processing tub and supplying a new chemical liquid having a lower mixing ratio of water than the drained chemical liquid into the processing tub and stopping a supply of the water to the processing tub.

8. The substrate processing method of claim 7, in the etching of the substrate at the first etching rate, the first film is etched at the first etching rate, and in the changing of the etching rate, the etching rate of the first film is lowered from the first etching rate to the second etching rate before the second film is exposed through the first film.

* * * * *